United States Patent
Ma et al.

(10) Patent No.: US 6,423,570 B1
(45) Date of Patent: Jul. 23, 2002

(54) METHOD TO PROTECT AN ENCAPSULATED DIE PACKAGE DURING BACK GRINDING WITH A SOLDER METALLIZATION LAYER AND DEVICES FORMED THEREBY

(75) Inventors: Qing Ma, San Jose; Xiao-Chun Mu, Saratoga; Quat T. Vu, Santa Clara, all of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/691,738

(22) Filed: Oct. 18, 2000

(51) Int. Cl.⁷ ............................................. H01L 21/44
(52) U.S. Cl. ................... 438/106; 257/612; 257/712; 257/714; 257/720; 257/722
(58) Field of Search .................... 438/106; 257/622, 257/712, 714, 720, 722

(56) References Cited

U.S. PATENT DOCUMENTS

| 5,353,498 | A | | 10/1994 | Fillion et al. ................ 29/840 |
| 5,422,513 | A | | 6/1995 | Marcinkiewicz et al. ... 257/668 |
| 5,455,457 | A | * | 10/1995 | Kurokawa .................... 257/712 |
| 5,497,033 | A | | 3/1996 | Fillion et al. ............... 257/723 |
| 5,514,906 | A | * | 5/1996 | Love et al. .................. 257/712 |
| 5,527,741 | A | | 6/1996 | Cole et al. .................. 438/107 |
| 5,703,400 | A | | 12/1997 | Wojnarowski et al. ...... 257/723 |
| 5,745,984 | A | | 5/1998 | Cole, Jr. et al. ............. 29/834 |
| 5,895,229 | A | * | 4/1999 | Carney et al. .............. 438/106 |
| 6,154,366 | A | * | 11/2000 | Ma et al. .................... 361/704 |
| 6,184,570 | B1 | * | 2/2001 | MacDonald, Jr. et al. .. 257/622 |

FOREIGN PATENT DOCUMENTS

| JP | 11045955 | 2/1999 |
| JP | 11312868 | 11/1999 |

* cited by examiner

*Primary Examiner*—Son T. Dinh
*Assistant Examiner*—Pho Luu
(74) *Attorney, Agent, or Firm*—Robert G. Winkle

(57) ABSTRACT

A microelectronic package including a microelectronic die having an active surface and at least one side. An encapsulation material is disposed adjacent the microelectronic die side(s). A portion of the encapsulation material is removed to expose a back surface of the microelectronic die which has a metallization layer disposed thereon. A protective layer is disposed on the metallization layer prior to encapsulation, such that when the portion of the encapsulation material is removed, the protective layer prevents the metallization layer from being damaged. After the portion of the encapsulation material is removed, the protective layer is removed and the metallization layer is exposed. A heat spreader may then be attached to the microelectronic die by abutting the heat spreader against the metallization layer and reflowing the metallization layer.

9 Claims, 20 Drawing Sheets

METHOD TO PROTECT AN ENCAPSULATED DIE PACKAGE DURING BACK GRINDING WITH A SOLDER METALLIZATION LAYER AND DEVICES FORMED THEREBY

BACKGROUND OF THE INVENTION

1. Field of the Invention

The present invention relates to apparatus and processes for packaging microelectronic dice. In particular, the present invention relates to a packaging technology that encapsulates a microelectronic die with an encapsulation material and utilizes a metallization layer to attach a heat spreader to the microelectronic die.

2. State of the Art

Higher performance, lower cost, increased miniaturization of integrated circuit components, and greater packaging density of integrated circuits are ongoing goals of the computer industry. As these goals are achieved, microelectronic dice become smaller. Of course, the goal of greater packaging density requires that the entire microelectronic die package be equal to or only slightly larger (about 10% to 30%) than the size of the microelectronic die itself. Such microelectronic die packaging is called a "chip scale packaging" or "CSP". However in such true CSP, the surface area provided by the microelectronic die active surface generally does not provide enough surface for all of the external contacts needed to contact the external component (not shown) for certain types of microelectronic dice (i.e., logic).

Additional surface area can be provided through the use of an interposer, such as a substrate (substantially rigid material) or a flex component (substantially flexible material). FIG. 18 illustrates a substrate interposer 222 having a microelectronic die 224 attached to and in electrical contact with a first surface 226 of the substrate interposer 222 through small solder balls 228. The small solder balls 228 extend between contacts 232 on the microelectronic die 224 and conductive traces 234 on the substrate interposer first surface 226. The conductive traces 234 are in discrete electrical contact with bond pads 236 on a second surface 238 of the substrate interposer 222 through vias 242 that extend through the substrate interposer 222. External contacts 244 (shown as solder balls) are formed on the bond pads 236. The external contacts 244 are utilized to achieve electrical communication between the microelectronic die 224 and an external electrical system (not shown).

The use of the substrate interposer 222 requires number of processing steps. These processing steps increase the cost of the package. Additionally, even the use of the small solder balls 228 presents crowding problems which can result in shorting between the small solder balls 228 and can present difficulties in inserting underfilling between the microelectronic die 224 and the substrate interposer 222 to prevent contamination and provide mechanical stability.

FIG. 19 illustrates a flex component interposer 252 wherein an active surface 254 of a microelectronic die 256 is attached to a first surface 258 of the flex component interposer 252 with a layer of adhesive 262. The microelectronic die 256 is encapsulated in an encapsulation material 264. Openings are formed in the flex component interposer 252 by laser abalation through the flex component interposer 252 to contacts 266 on the microelectronic die active surface 254 and to selected metal pads 268 residing within the flex component interposer 252. A conductive material layer is formed over a second surface 272 of the flex component interposer 252 and in the openings. The conductive material layer is patterned with standard photomask/etch processes to form conductive vias 274 and conductive traces 276. External contacts are formed on the conductive traces 276 (shown as solder balls 278 surrounded by a solder mask material 282 proximate the conductive traces 276).

Another problem arising from the fabrication of a smaller microelectronic dice is that the density of power consumption of the integrated circuit components in the microelectronic dice has increased, which, in turn, increases the average junction temperature of the dice. If the temperature of the microelectronic die becomes too high, the integrated circuits of the semiconductor die may be damaged or destroyed. Furthermore, for microelectronic dice of equivalent size, the overall power increases which presents the same problem of increased power density.

Thus, it may be necessary to attach a heat spreader to the microelectronic die. FIG. 20 illustrates a heat spreader 288 attached to the microelectronic die 256 as shown in FIG. 19. However, prior to attaching the heat spreader 288 to the microelectronic 256, a back surface 286 of the microelectronic die 256 must be exposed. This is generally achieved by grinding away the back surface 284.(see FIG. 19) of the encapsulation material 264 which can damage the microelectronic die 256.

Therefore, it would be advantageous to develop new apparatus and techniques to expose the back surface of a microelectronic die for attachment of a heat spreader with potentially damaging the microelectronic die.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE ILLUSTRATED EMBODIMENT

Figure 1:
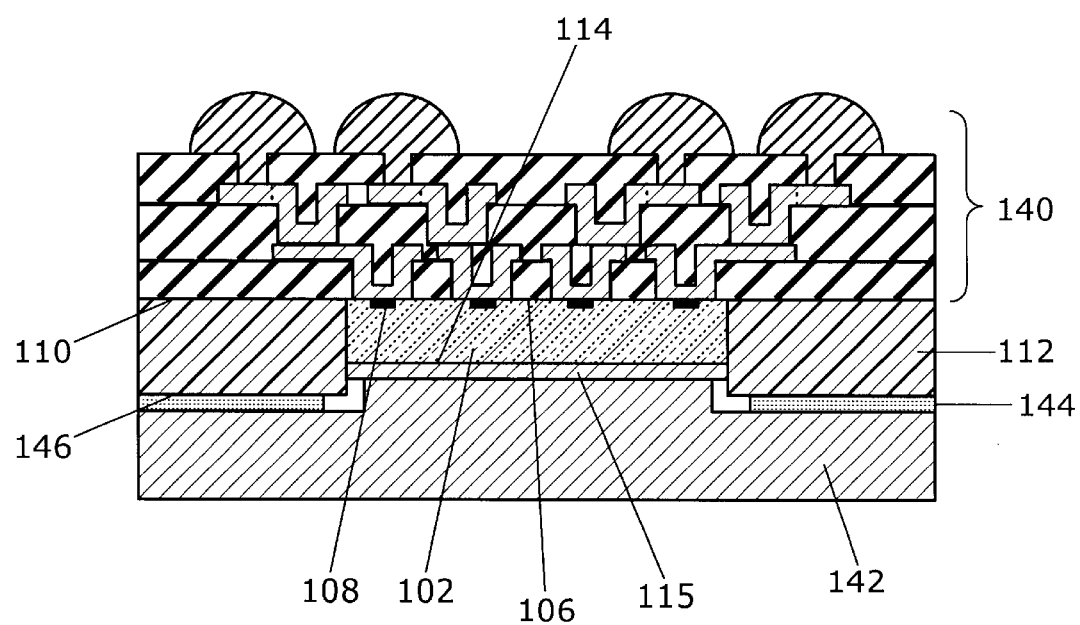
FIG. 1 is a side cross-sectional view of an embodiment of a microelectronic package, according to the present invention.

In the following detailed description, reference is made to the accompanying drawings that show, by way of illustration, specific embodiments in which the invention may be practiced. These embodiments are described in sufficient detail to enable though skilled in the art to practice the invention. It is to be understood that the various embodiments of the invention, although different, are not necessarily mutually exclusive. For example, a particular feature, structure, or characteristic described herein, in connection with one embodiment, may be implement within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention relates to a packaging technology that fabricates interconnection layers on an encapsulated microelectronic die and on the encapsulation material that covers the microelectronic die. An exemplary microelectronic package includes a microelectronic die having an active surface and at least one side. An encapsulation material is disposed adjacent the microelectronic die side(s). A portion of the encapsulation material is removed to expose a back surface of the microelectronic die which has a metallization layer disposed thereon. A protective layer is disposed on the metallization layer prior to encapsulation, such that when the portion of the encapsulation material is removed, the protective layer prevents the metallization layer from being damaged. After the portion of the encapsulation material is removed, the protective layer is removed and the metallization layer is exposed. A heat spreader may then be attached to the microelectronic die by abutting the heat spreader against the metallization layer and reflowing the metallization layer.

FIG. 1 illustrates an embodiment of the present invention comprising a microelectronic die 102 encapsulated in an encapsulation material 112. An interconnection layer 140 is disposed on a first surface 110 of the encapsulation material 112 and an active surface 106 of the microelectronic die 102. A heat spreader 142 is attached to a back surface 114 of the microelectronic die 102 with a thermally conductive metallization layer 115. The heat spreader 142 may also be attached to a second surface 146 of the encapsulation material 112 with an adhesive layer 144.

Figure 2:
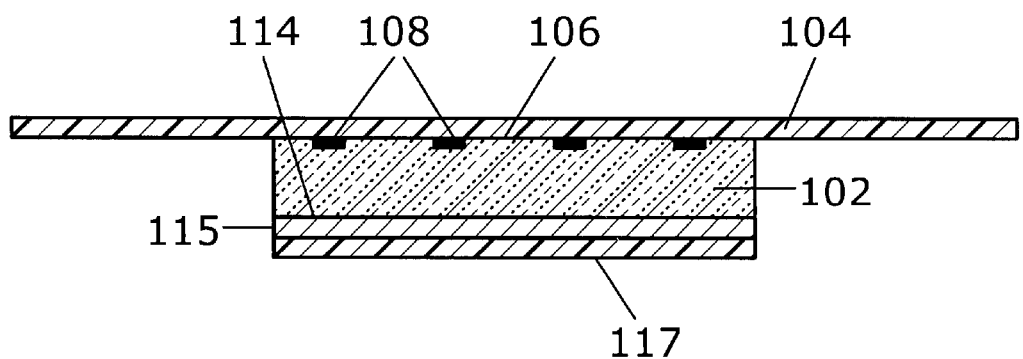
FIGS. 2–14 are side cross-sectional views of an embodiment of a process of forming a microelectronic package, according to the present invention.

FIGS. 2–14 illustrate a process of forming the microelectronic package illustrated in FIG. 1. As shown in FIG. 2, a protective film 104 is abutted against the microelectronic die active surface 106 to protect the microelectronic die active surface 106 from any contaminants. The microelectronic die active surface 106 has at least one contact 108 disposed thereon. The contacts 108 are in electrical contact with integrated circuitry (not shown) within the microelectronic die 102. The microelectronic die 102 may be any known active or passive microelectronic device including, but not limited to, logic (CPUs), memory (DRAM, SRAM, SDRAM, etc.), controllers (chip sets), capacitors, resistors, inductors, and the like.

The protective film 104 is preferably a substantially flexible material, such as Kapton® polyimide film (E. I. du Pont de Nemours and Company, Wilmington, Del.), but may be made of any appropriate material, including metallic films. The protective film 104 may have a weak adhesive, such as silicone or acrylic, which attaches to the microelectronic die active surface 106. This adhesive-type film may be applied prior to placing the microelectronic die 102 in a mold, liquid dispense encapsulation system (preferred), or other such equipment used for the encapsulation process. The protective film 104 may also be a non-adhesive film, such as a ETFE (ethylene-tetrafluoroethylene) or Teflon® film, which is held on the microelectronic die active surface 106 by an inner surface of the mold or other such equipment during the encapsulation process.

The microelectronic die 102 further includes a metallization layer 115 disposed on the back surface 114 thereof. The metallization layer 115 is used to achieve a thermally conductive bond between microelectronic die 102 and a subsequently attached heat spreader 142 (shown in FIG. 1). The metallization layer 115 is preferably formed on a semiconductor wafer (not shown) prior to dicing the semiconductor wafer into individual microelectronic dice 102 and preferably comprises a solder material, including, but not limited to, material such as a lead, tin, indium, gallium, bismuth, cadmium, zinc, copper, gold, silver, antimony, germanium, and alloys thereof. The metallization layer 115 may be disposed on the semiconductor wafer (or the individual microelectronic die 102) by any known technique, including but not limited to plating, sputter coating, plasma deposition, and the like. A protective layer 117 is disposed on the metallization layer 115. The purpose of the protective layer 117 will be subsequently discussed. The protective layer 117 is preferably disposed on the metallization layer 115 prior to dicing the semiconductor wafer into individual microelectronic dice 102.

Figure 3:
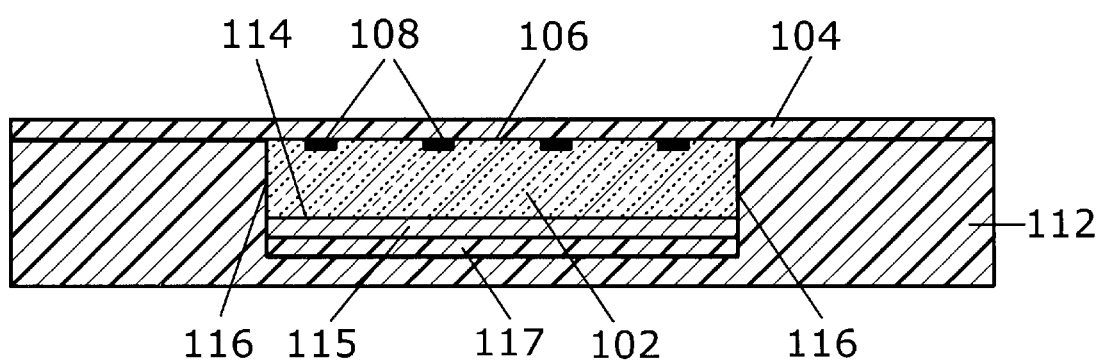

As shown in FIG. 3, the microelectronic die 102 is then encapsulated with an encapsulation material 112, such as plastics, resins, epoxies, elastomeric (e.g., rubbery) materials, and the like, that covers the back surface 114 and side(s) 116 of the microelectronic die 102. The encapsulation of the microelectronic die 102 may be achieved by any known process, including but not limited to transfer and compression molding, and dispensing (preferred). The encapsulation material 112 provides mechanical rigidity, protects the microelectronic die 102 from contaminants, and provides surface area for the build-up of trace layers.

Figure 4:
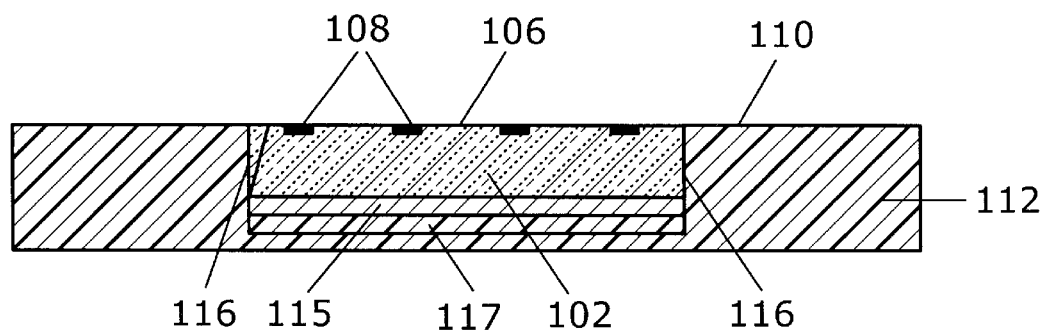

After encapsulation, the protective film 104 is removed, as shown in FIG. 4, to expose the microelectronic die active surface 106. As also shown in FIG. 4, the encapsulation material 112 is preferably molded or dispensed to form at least one first encapsulation material first surface 110 which is substantially planar to the microelectronic die active surface 106. The encapsulation material first surface 110 will be utilized in further fabrication steps as additional surface area for the formation of interconnection layers, such as dielectric material layers and conductive traces.

Figure 5:
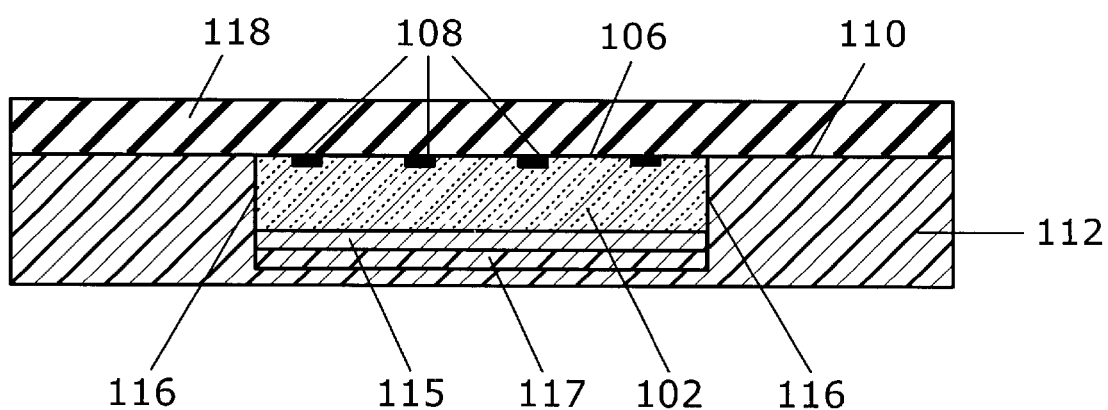

A first dielectric layer 118, such as epoxy resin, polyimide, bisbenzocyclobutene, and the like, is disposed over the microelectronic die active surface 106, the contacts 108, and the encapsulation material first surface 110, as shown in FIG. 5. The dielectric layers of the present invention are preferably filled epoxy resins available from Ibiden U.S.A. Corp., Santa Clara, Calif. U.S.A. and Ajinomoto U.S.A., Inc., Paramus, N.J. U.S.A. The formation of the first dielectric layer 118 may be achieved by any known process, including but not limited to film lamination, spin coating, roll-coating and spray-on deposition.

Figure 6:
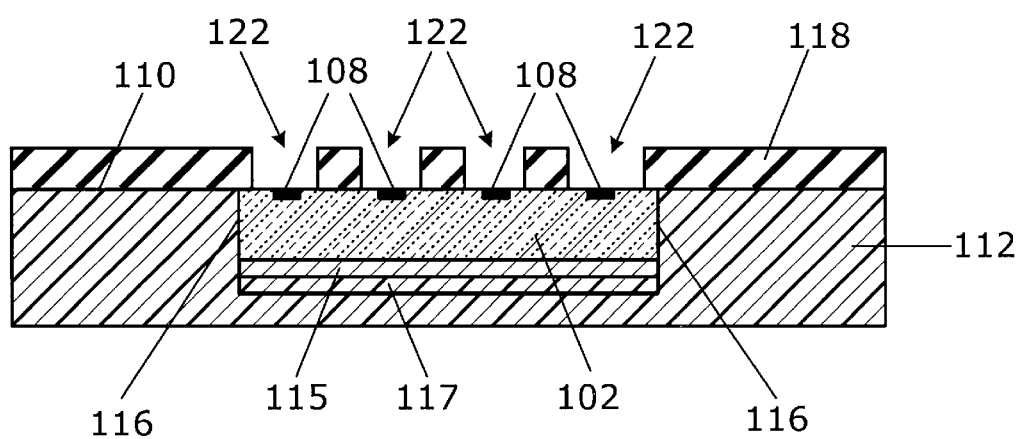

As shown in FIG. 6, a plurality of vias 122 are then formed through the first dielectric layer 118. The plurality of vias 122 may be formed any method known in the art, including but not limited to laser drilling, photolithography, and, if the first dielectric layer 118 is photoactive, forming the plurality of vias 122 in the same manner that a photoresist mask is made in a photolithographic process, as known in the art.

Figure 7:
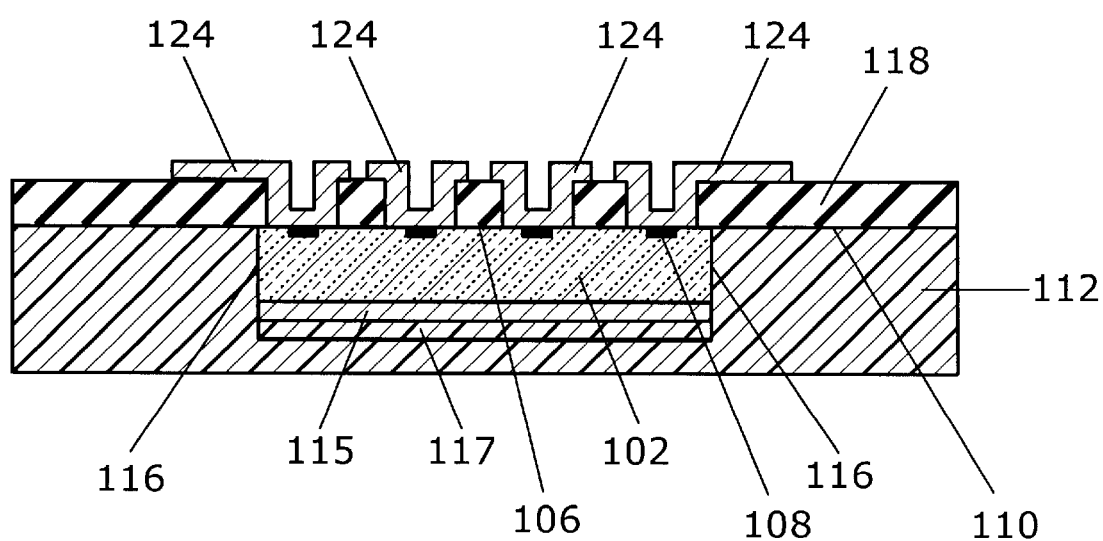

A plurality of conductive traces 124 is formed on the first dielectric layer 118, as shown in FIG. 7, wherein a portion of each of the plurality of conductive traces 124 extends into at least one of said plurality of vias 122 to make electrical contact with the contacts 108. The plurality of conductive traces 124 may be made of any applicable conductive material, such as copper, aluminum, and alloys thereof. As shown in FIG. 7, at least one conductive trace may extend adjacent the microelectronic die active surface 106 and adjacent said encapsulation material first surface 110.

The plurality of conductive traces 124 may be formed by any known technique, including but not limited to semi-additive plating and photolithographic techniques. An exemplary semi-additive plating technique can involve depositing a seed layer, such as sputter-deposited or electroless-deposited metal on the first dielectric layer 118. A resist layer is then patterned on the seed layer, such as a titanium/copper alloy, followed by electrolytic plating of a layer of metal, such as copper, on the seed layer exposed by open areas in the patterned resist layer. The patterned resist layer is stripped and portions of the seed layer not having the layer of metal plated thereon is etched away. Other methods of forming the plurality of conductive traces 124 will be apparent to those skilled in the art.

Figure 8:
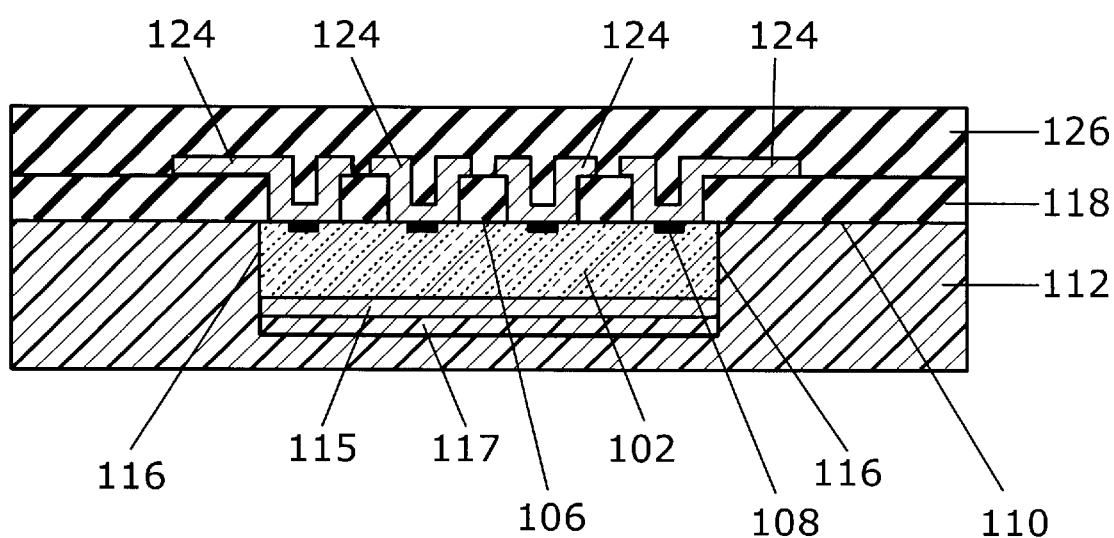

As shown in FIG. 8, a second dielectric layer 126 is disposed over the plurality of conductive traces 124 and the first dielectric layer 118. The formation of the second dielectric layer 126 may be achieved by any known process, including but not limited to film lamination, roll-coating and spray-on deposition.

Figure 9:
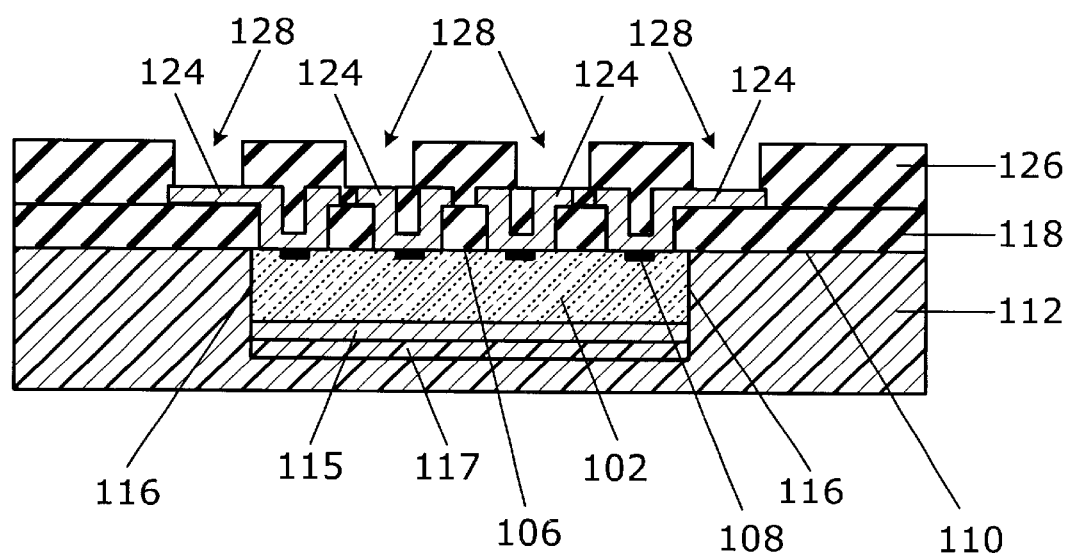

As shown in FIG. 9 a plurality of second vias 128 are then formed through the second dielectric layer 126. The plurality of second vias 128 may be formed any method known in the art, including but not limited to laser drilling and, if the second dielectric layer 126 is photoactive, forming the plurality of second vias 128 in the same manner that a photoresist mask is made in a photolithographic process, as known in the art.

If the plurality of conductive traces 124 is not capable of placing the plurality of second vias 128 in an appropriate position, then other portions of the conductive traces are formed in the plurality of second vias 128 and on the second dielectric layer 126, another dielectric layer formed thereon, and another plurality of vias is formed in the dielectric layer, such as described in FIG. 7–9. The layering of dielectric layers and the formation of conductive traces can be repeated until the vias are in an appropriate position and sufficient electrical connectivity is established to enable the required electrical performance. Thus, portions of a single conductive trace be formed from multiple portions thereof and can reside on different dielectric layers.

Figure 10:
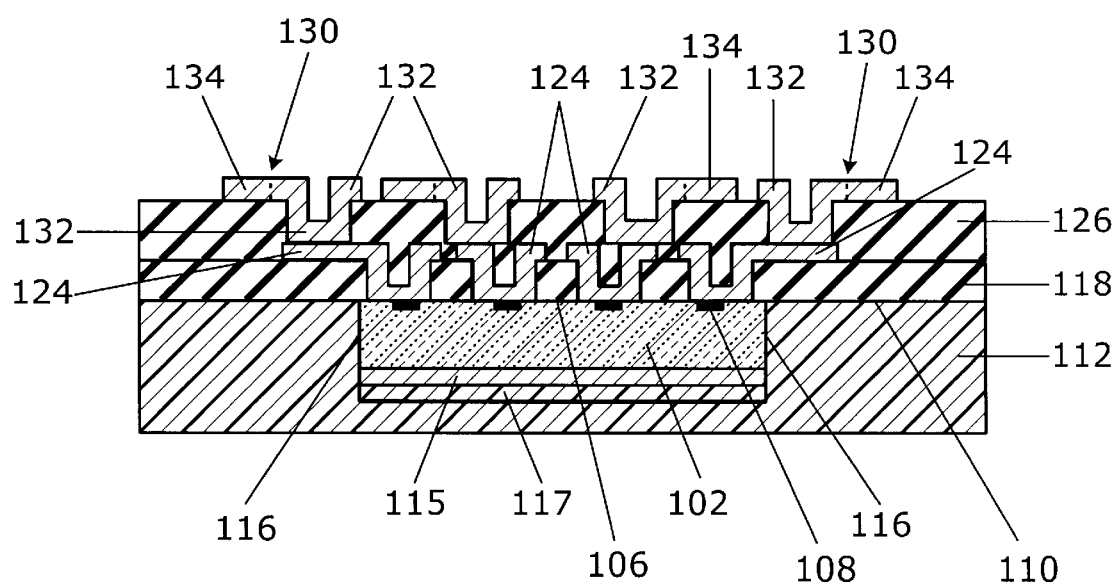

A second plurality of conductive traces 132 may be formed, wherein a portion of each of the second plurality of conductive traces 132 extends into at least one of said plurality of second vias 128. The second plurality of conductive traces 132 each include a landing pad 134 (an enlarged area on the traces demarcated by a dashed line 130), as shown in FIG. 10.

Figure 11:
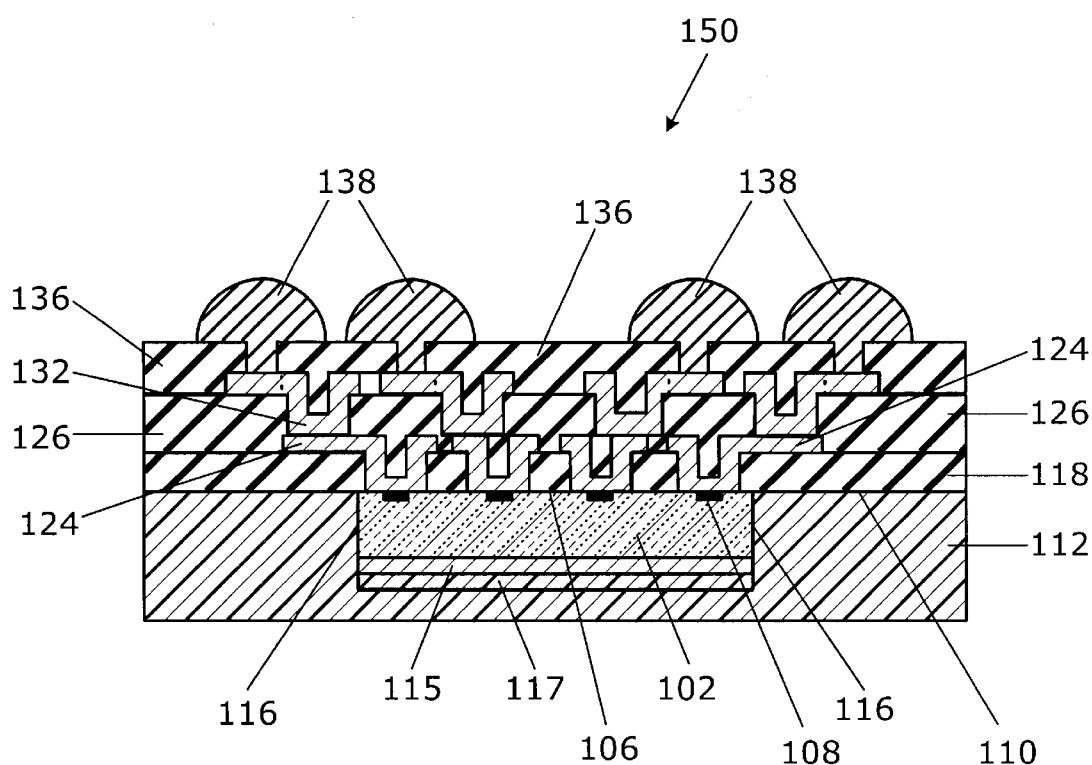

Once the second plurality of conductive traces 132 and landing pads 134 are formed, they can be used in the formation of conductive interconnects, such as solder bumps, solder balls, pins, and the like, for communication with external components (not shown). For example, a solder mask material 136 can be disposed over the second dielectric layer 126 and the second plurality of conductive traces 132 and landing pads 134. A plurality of vias is then formed in the solder mask material 136 to expose at least a portion of each of the landing pads 134. A plurality of conductive bumps 138, such as solder bumps, can be formed, such as by screen printing solder paste followed by a reflow process or by known plating techniques, on the exposed portion of each of the landing pads 134, as shown in FIG. 11, to form a microelectronic die package 150.

Although the previous description discussed a build-up layer technique for forming the interconnection layer 140, the present invention is not so limited. It will be understood by one skilled in the art that any known technique, including a flex component interposer, could be used to from an interconnection layer.

For the attachment of the heat spreader 142 (shown in FIG. 1), the metallization layer 115 must be exposed. Thus, a portion of the encapsulation material 112 must be removed to do so. This is preferably achieved by a grinding process. However, the grinding process can damage the metallization layer 115. A damaged metallization layer 115 may result in an inefficient thermal contact between the microelectronic die 102 and the heat spreader 142. Thus, the protective layer 117 is utilized to prevent damage to the metallization layer 1 15. The protective layer 117 is preferably a material that is easily removed. For example, the protective layer 117 may be a resist material, as known in the art, which can be easily, chemically dissolved. In another example, the protective layer 117 may be a polyimide film, such as Kapton® film having a silicone or acrylic adhesive, which can be peeled cleanly off the metallization layer 115.

Figure 12:
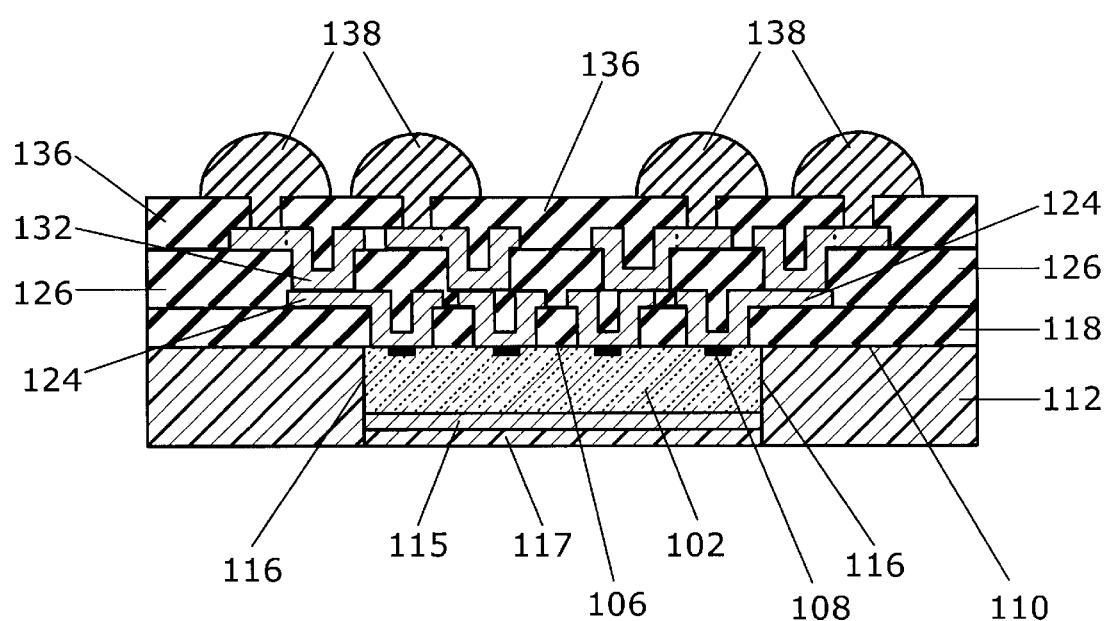
Figure 13:
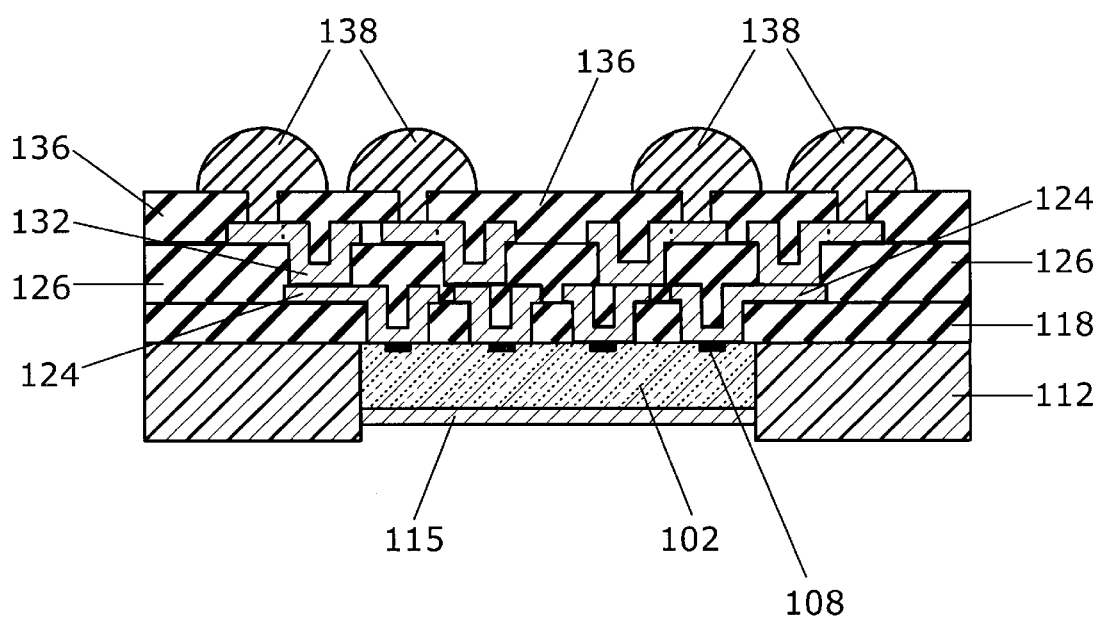

Thus, as shown in FIG. 12, a grinding process removes a portion of the encapsulation material 112 which does not completely remove the protective layer 117 (i.e., stops at or in the protective layer 117). The protective layer 117 is then removed to expose the metallization layer 115, as shown in FIG. 13.

Figure 14:
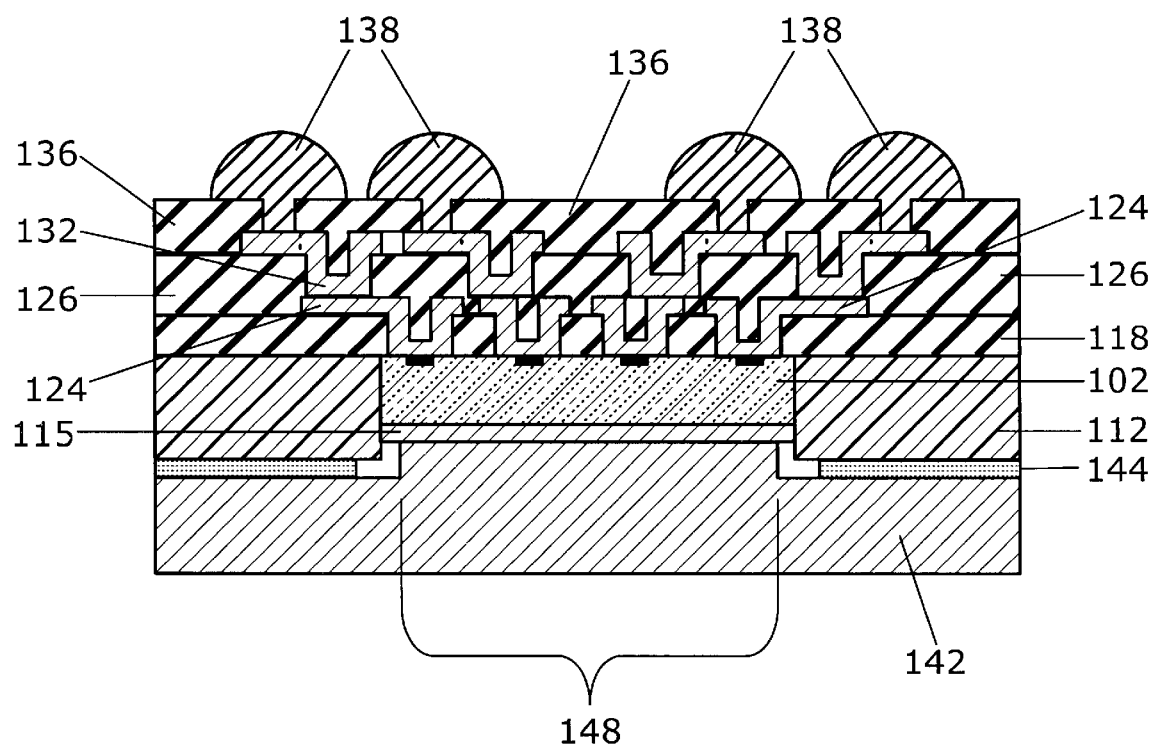

As shown in FIG. 14, the heat spreader 142 is then abutted against the metallization layer 115 and attached by reflowing the metallization layer 115. An adhesive layer 144 may also be used to attach a portion of the heat spreader 142 to the encapsulation material 112. The adhesive layer 144 is preferably pliable such that minimal thermal stress are induced on the encapsulation material 112. The heat spreader 142 may have an elevated area 148 to compensate for the thickness of the protective film 117. The heat spreader 142 is preferably a highly thermally conductive material, including but not limited to, copper, aluminum, and alloys thereof.

Figure 15:
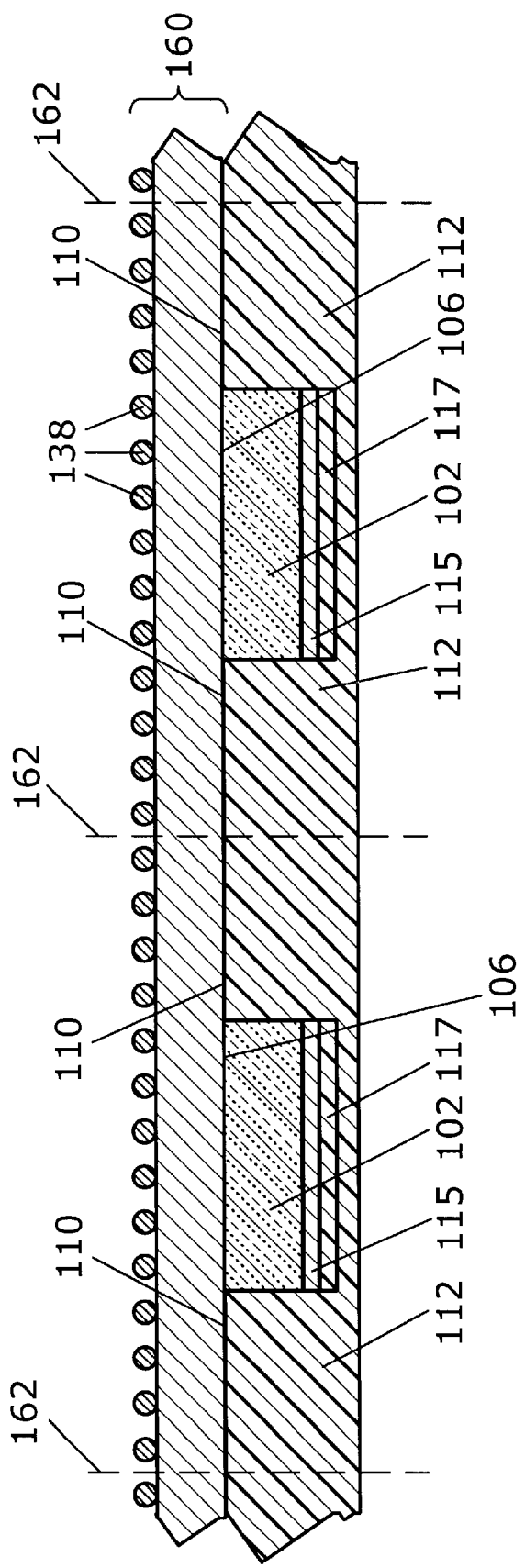
FIG. 15 is a side cross-sectional view of plurality of microelectronic dice encapsulated in an encapsulation and an interconnect layer formed over thereon, according to the present invention.

It is, of course, understood that the microelectronic die package 150, as shown in FIG. 11, can be fabricated simultaneously with a number of other microelectronic die packages. FIG. 15 illustrates a plurality of microelectronic dice 102 encapsulated with encapsulation material 112. At least one interconnection layer is formed on the microelectronic dice active surfaces 106 and the encapsulation material first surface 110 in the manner previously discussed. The layer(s) of dielectric material and conductive traces comprising the interconnection layer is simply designated together as interconnection layer 160 in FIG. 15. The individual microelectronic dice 102 are then singulated along lines 162 (cut) through the interconnection layer 160 and the encapsulation material 112 to form at least one singulated microelectronic die package 150, as shown in FIG. 11. It is, of course, understood that the grinding process could be performed prior to singulating the individual microelectronic dice packages.

Figure 16:
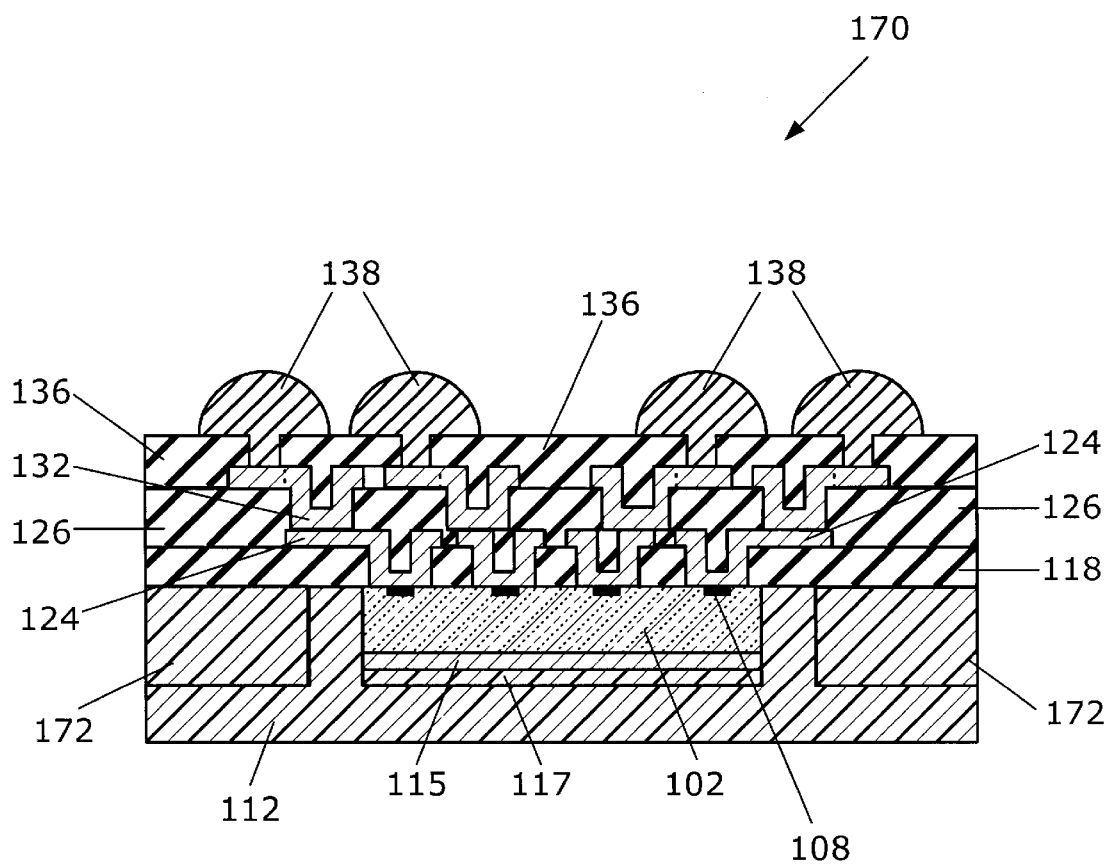
FIG. 16 is a side cross-sectional view of another embodiment of a microelectronic package that includes a microelectronic package core, according to the present invention.

It is further understood that the encapsulation material 112 may include a microelectronic package core 172 surrounding the microelectronic die 102 to provide mechanical stability, as shown in FIG. 16, to form a microelectronic die package 170, which is similar to the microelectronic die package 150 of FIG. 11. The microelectronic package core 172 is position adjacent to said microelectronic die 102, preferably substantially surrounding said microelectronic die 102. The encapsulation material 112 is disposed in the space between the microelectronic die 102 and the microelectronic package core 172. The material used to fabricate the microelectronic package core 172 may include, but is not limited to, a Bismaleimide Triazine ("BT") resin based laminate material, an FR4 laminate material (a flame retarding glass/epoxy material), various polyimide laminate materials, ceramic material, and the like, and metallic materials (such as copper) and the like.

Figure 17:
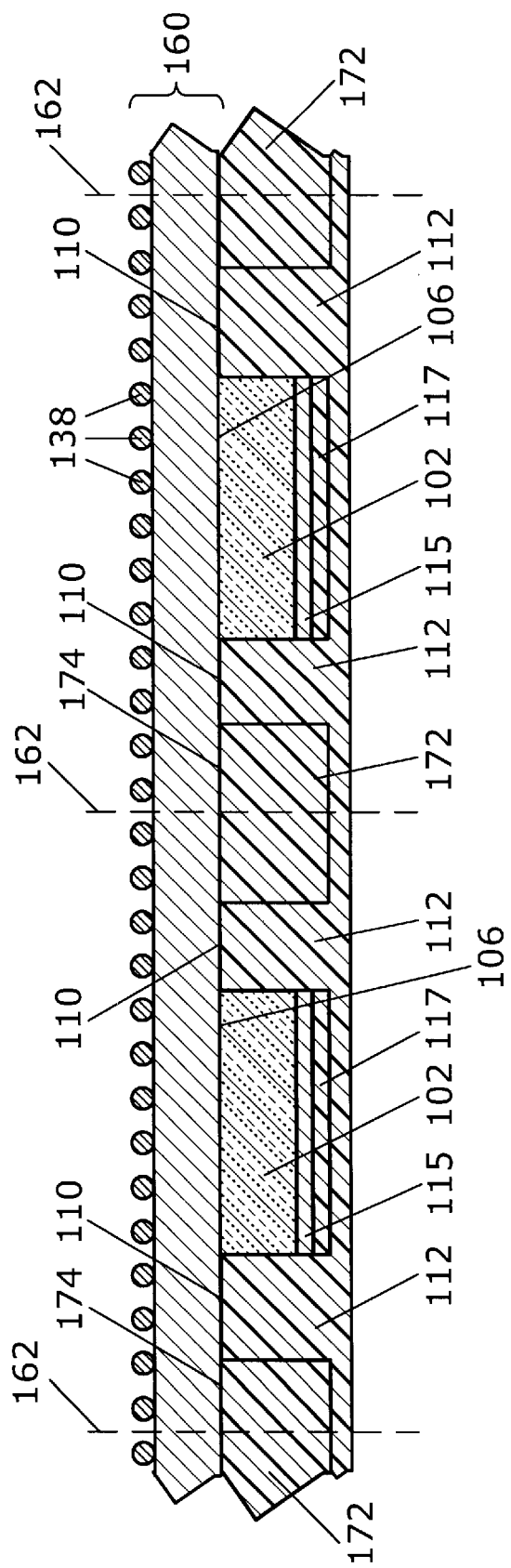
FIG. 17 is a side cross-sectional view of plurality of microelectronic dice encapsulated in an encapsulation and a microelectronic package core, and an interconnect layer formed over thereon, according to the present invention.
Figure 18:
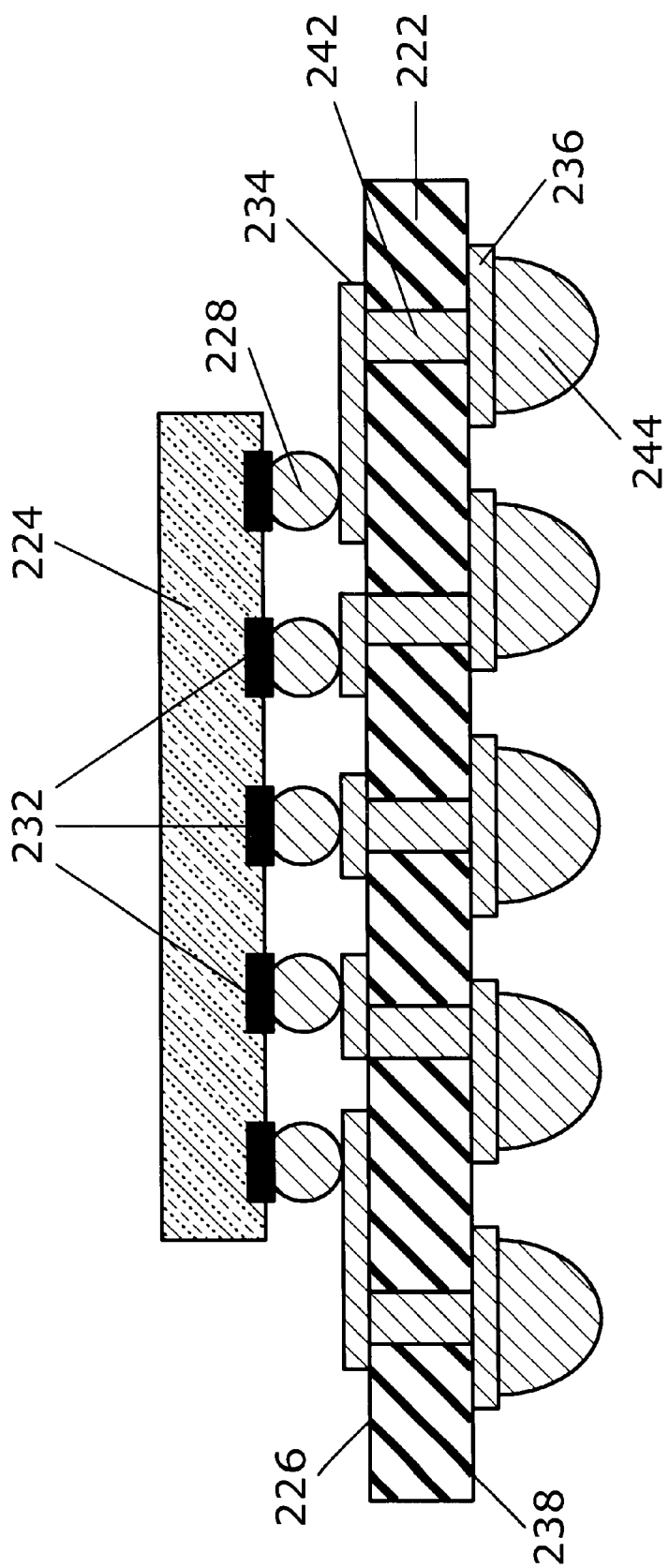
FIG. 18 is a cross-sectional view of a CSP of a microelectronic device utilizing a substrate interposer, as known in the art.
Figure 19:
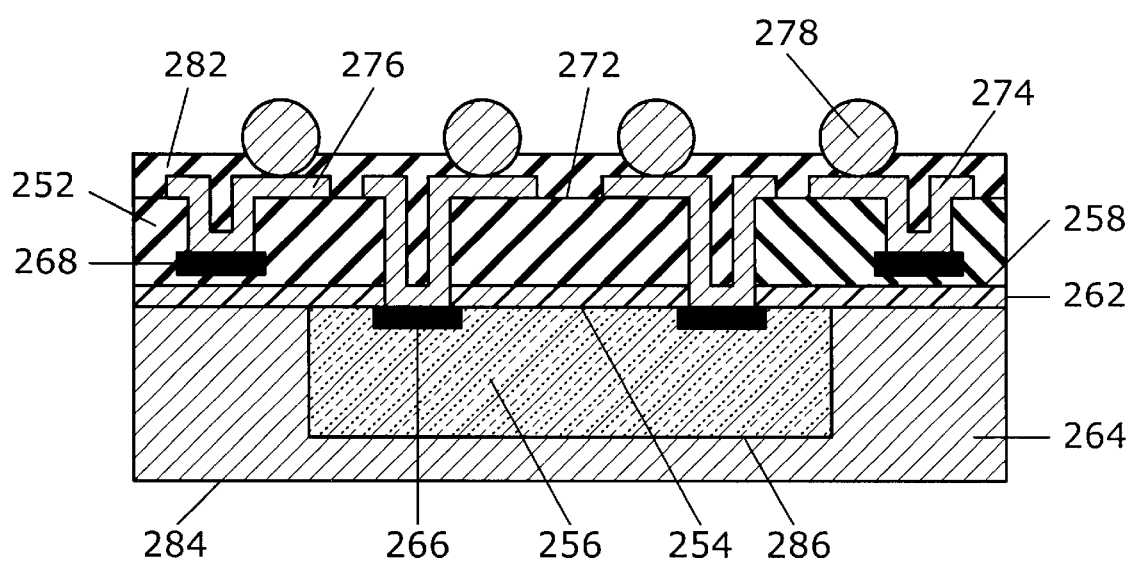
FIG. 19 is a cross-sectional view of a CSP of a microelectronic device utilizing a flex component interposer, as known in the art.
Figure 20:
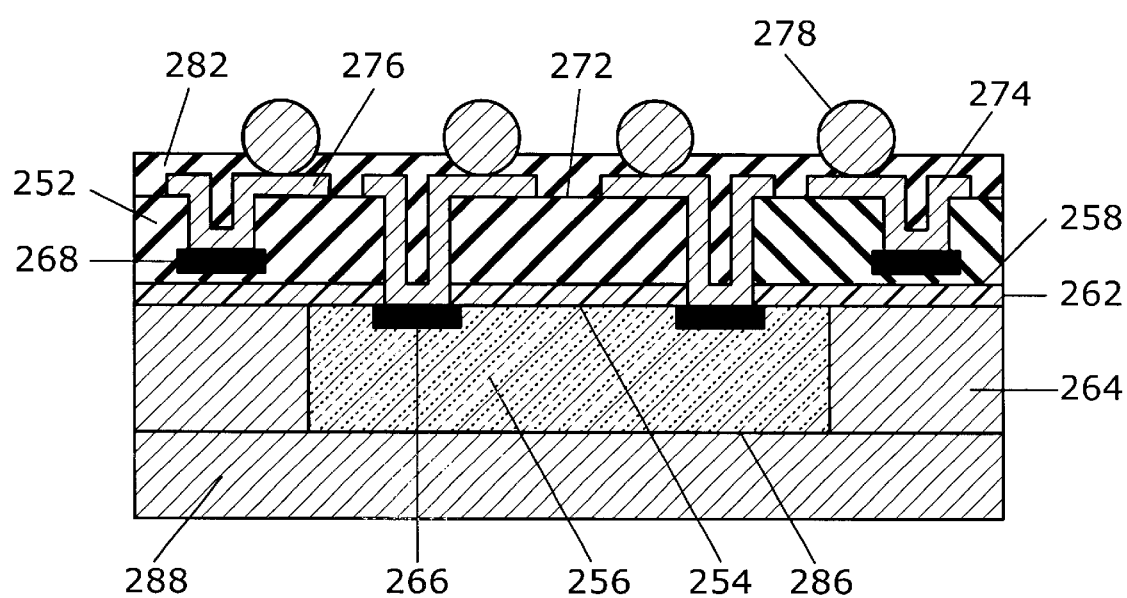
FIG. 20 is a cross-sectional view of the CSP of FIG. 19 having a heat spreader attached thereto, as known in the art.

It is yet further understood that the microelectronic die package 170, as shown in FIG. 16, can also be fabricated simultaneously with a number of other microelectronic die packages. FIG. 17 illustrates a plurality of microelectronic dice 102 encapsulated with encapsulation material 112 within the microelectronic package core 172. Preferably, the microelectronic package core 172 includes a plurality of openings in which the microelectronic dice 102 reside. At least one interconnection layer is formed on the microelectronic dice active surfaces 106, the microelectronic package core first surface 174, and the encapsulation material first surface 110 in the manner previously discussed. The layer(s) of dielectric material and conductive traces comprising the interconnection layer is simply designated together as interconnection layer 160 in FIG. 17. The individual microelectronic dice 102 are then singulated along lines 162 (cut) through the interconnection layer 160 and the microelectronic package core 172 to form at least one singulated microelectronic die package 170, as shown in FIG. 16. It is, of course, understood that the grinding process could be performed prior to singulating the individual microelectronic dice packages.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An intermediate microelectronic package, comprising:
  a microelectronic die having an active surface, a back surface, and at least one side;
  encapsulation material adjacent said at least one microelectronic die side;
  a metallization layer disposed on said microelectronic die back surface; and
  a protective layer disposed on said metallization layer.

2. The microelectronic package of claim 1, wherein said encapsulation material includes at least one surface substantially planar to said microelectronic die active surface.

3. The microelectronic package of claim 2, further including a first dielectric material layer disposed on at least a portion of said microelectronic die active surface and said encapsulation material surface.

4. The microelectronic package of claim 3, further including at least one conductive trace disposed on said first dielectric material layer and in electrical contact with said microelectronic die active surface.

5. The microelectronic package of claim 1, further including a microelectronic package core adjacent said microelectronic die, wherein at least a portion of said encapsulation material is disposed between said microelectronic die and said microelectronic package core.

6. A microelectronic package, comprising:
  a microelectronic die having an active surface, a back surface, and at least one side;
  encapsulation material adjacent said at least one microelectronic die side, said encapsulation material having at least one surface substantially planar to said microelectronic die active surface;
  a metallization layer disposed on said microelectronic die back surface; and
  a heat spreader attached to said microelectronic die back surface with said metallization layer.

7. The microelectronic package of claim 6, further including a first dielectric material layer disposed on at least a portion of said microelectronic die active surface and said encapsulation material surface.

8. The microelectronic package of claim 7, further including at least one conductive trace disposed on said first dielectric material layer and in electrical contact with said microelectronic die active surface.

9. The microelectronic package of claim 6, further including an adhesive material disposed between a portion of the heat spreader and said encapsulation material.

* * * * *